United States Patent [19]

Ohagen

[11] Patent Number: 4,742,015
[45] Date of Patent: May 3, 1988

[54] METHOD FOR PRODUCING A PROTECTIVE ARRANGEMENT FOR A FIELD-EFFECT TRANSISTOR

[75] Inventor: Manfred Ohagen, Untergruppenbach, Fed. Rep. of Germany

[73] Assignee: Telefunken electronic GmbH, Heilbronn, Fed. Rep. of Germany

[21] Appl. No.: 35,265

[22] Filed: Apr. 6, 1987

Related U.S. Application Data

[62] Division of Ser. No. 703,180, Feb. 19, 1985, abandoned.

[30] Foreign Application Priority Data

Mar. 7, 1984 [DE] Fed. Rep. of Germany ....... 3408285

[51] Int. Cl.[4] .................. H01L 21/385; H01L 21/425
[52] U.S. Cl. ........................................ 437/27; 437/59; 437/904
[58] Field of Search ............................ 437/59, 904, 27

[56] References Cited

U.S. PATENT DOCUMENTS

| | | | |
|---|---|---|---|
| 3,788,904 | 1/1974 | Haraszti | 437/59 |
| 3,892,609 | 7/1975 | Coppen | 357/52 |
| 3,967,295 | 6/1976 | Stewart | 357/23.13 |
| 4,066,918 | 1/1978 | Huener et al. | 357/23.13 |
| 4,139,935 | 2/1979 | Bertin et al. | 357/23.13 |
| 4,449,158 | 5/1984 | Taira | 357/23.13 |

FOREIGN PATENT DOCUMENTS

| | | |
|---|---|---|
| 1639254 | 7/1970 | Fed. Rep. of Germany . |
| 1639255 | 12/1971 | Fed. Rep. of Germany . |
| 2131167 | 11/1979 | Fed. Rep. of Germany . |
| 1170705 | 2/1967 | United Kingdom . |
| 2090701 | 7/1982 | United Kingdom ............ 357/23.13 |

OTHER PUBLICATIONS

S. Tokoda, "MOS Semiconductor Device ", *Patents Abstracts of Japan*, E-91, Jan. 23, 1982, vol. 6, No. 12.

S. Tokoda, "MOS Type Semiconductor Device", *Patents Abstracts of Japan*, E-138, Sep. 17, 1979, vol. 3, No. 111.

G. B. Stephens, "FET Gate Protection Diode with Asymmetric, Dual-Polarity Voltage Capability", *IBM Technical Disclosure Bulletin*, vol. 25, No. 1, Jun. 1982, pp. 400-401.

Electronics International, Oct. 6, 1982, pp. 70-71.

H. E. Maes et al., "The Implanted Zener Diode (IZD) as an Input Protection Device for MOS Integrated Circuits", *IEEE Transactions on Electron Devices*, vol. Ed.-28, No. 9, Sep. 1981, pp. 1071-1077.

*Primary Examiner*—George T. Ozaki
*Attorney, Agent, or Firm*—Spencer & Frank

[57] ABSTRACT

The invention relates to a protective arrangement for field-effect transistors with an insulated gate electrode. An integrated, indiffused protective diode whose breakdown voltage is smaller than that of the gate insulating layer is used therefor. The gist of the invention is that the breakdown voltage of the protective diode is set by two implantation processes, one of which is substantially limited to the region containing the in-diffused diode and the other of which substantially covers the surface of the substrate other than at least the channel region of the field-effect transistor so as to simultaneously increase the field inversion voltage.

6 Claims, 4 Drawing Sheets

METHOD FOR PRODUCING A PROTECTIVE ARRANGEMENT FOR A FIELD-EFFECT TRANSISTOR

This is a division of application Ser. No. 703,180, filed Feb. 19, 1985, now abandoned.

BACKGROUND OF THE INVENTION

The invention relates to a method of producing a protctive arrangement for field-effect transistors with an insulated gate electrode using an integrated, indiffused protective diode. Such protective arrangements are known, for example, from German Offenlegungsschrift No. 1 639 254 and from German Auslegeschrift No. 1 639 255. The purpose of these protective arrangements is to protect the sensitive gate areas of the field-effect transistors from overvoltages. The disadvantage of the known protective arrangments is that the protective diodes exhibit characteristics which are too soft and, in the event of load, are shifted, for example, by surface charges.

SUMMARY OF THE INVENTION

The object underlying the invention is, therefore, to provide a method of producing a protective arrangement wherein the breakdown characteristics of the protective diode may be set precisely. This object is attained in a protective arrangement of the above-described kind by the breakdown voltage of the protective diode being set by at least one implantation process.

The protective diode is therefore produced by a combined diffusion-implantation-process, so that the breakdown characteristic values of the protective diode may be easily and precisely set. It has, furthermore, been ascertained that even after repeated loading of the protective diode in the breakdown area, the characteristics of the protective arrangement still remain substantially unchanged.

The protective diode may be arranged as a separate component in the semiconductor member containing the field-effect transistors. A combination of the protective diode for certain applications of the field-effect transistors with the source zone and the drain zone, respectively, is also possible. A sub-area of the source substrate junction and the drain substrate junction, respectively, then forms the protective diode.

The breakdown voltage of the protective diode may also be set by two successive implantation processes, with one implantation process simultaneously increasing the surface doping of the semiconductor component outside of the diode area in order to raise the field inversion voltage to a value located above the supply voltage of the circuit. Only the transistor area and the channel area, respectively, of the field-effect transistors are then excluded from the implantation processes.

BRIEF DESCRIPTION OF THE DRAWINGS

Further advantageous embodiments of the invention are apparent from the subclaims. The invention will now be explained in further detail with reference to three embodiments.

DESCRIPTION OF THE PREFERRED EMBODIMENTS

Figure 1:
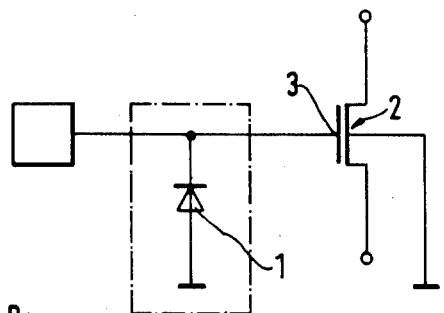
FIG. 1 shows the principal design of the protective circuit.

FIG. 1 shows an MOS field-effect transistor 2 whose substrate is connected to reference potential.

Connected parallel to the gate substrate section is a protective diode 1 which is connected with its cathode to the gate electrode 3 of the MOS field-effect transistor. The breakdown voltage of the protctive diode 1 must be less than the breakdown voltage of the gate oxide in order to prevent an irreversible destruction of the field-effect transistor.

Figure 2:
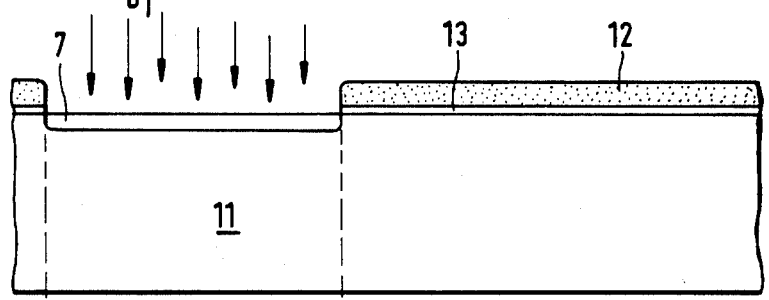
FIGS. 2 to 6 show various production stages of this protective circuit.

In order to produce the protective circuit according to FIG. 1, an, for example, n conducting silicon semiconductor member 11 is first exposed in accordance with FIG. 2 to a first field implantation $D_1$. The implantation area is somewhat larger than the surface area intended for the protective diode. All of the remaining parts of the semiconductor surface are covered with a masking layer 13 and with a photoresist layer 12, with the photoresist layer 12 serving as to open of the implantation window. The insulating layer 13 consists, for example, of siliccon dioxide which is 0.1 $\mu$m thick, while the resist layer 12 is, for example, 1 $\mu$m thick. The field implantation produces in the semiconductor member an implantation area 7 containing impurities, which after their curing or annealing produce the n conduction type. The penetration depth of the area 7 is, for example, 0.2 $\mu$m. The implanted ions may, for example, be phosphorous or arsenic ions. In one embodiment, the first implantation process is designed so as to obtain a breakdown voltage of approximately $-27$ V after termination of all of the further diffusion and high-temperature processes. The implanted charge carriers are not activated until a second implantation step has been carried out.

Figure 3:
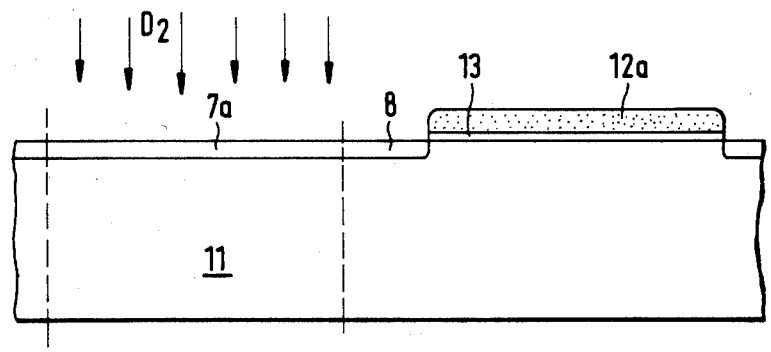

In accordance with FIG. 3, the second field implantation $D_2$ affects a larger area 8 of the semiconductor surface. The semiconductor surface only remains covered with an oxide layer 13 and a resist layer 12a in those areas intended for accommodation of the actual field-effect transistor. In all of the remaining surface areas, impurities, for example, phosphorus or arsenic, are implanted, and, again, a penetration depth of approximately 0.2 $\mu$m is provided. In the first implantation area 7, the implanted charge carriers add up, which results in the creation of an area 7a in which charge carriers, for example, with a total dose of $5.4 \times 10^{12}$ ions per $cm^2$, were implanted. After termination of all of the high-temperature processes, this total dose would produce a breakdown voltage of the protective diode of approximately $-23$ V.

In the remaining field area, the implantation dose $D_2$ results in an increase in the field inversion voltage since the areas near the surface exhibit an increase in the concentration of impurities after curing of the implanted charge carriers.

Figure 4:
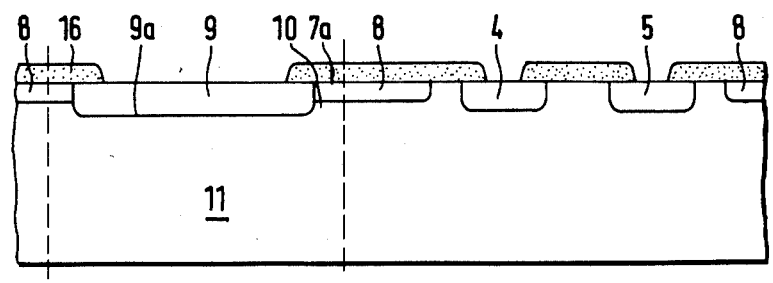

In accordance with FIG. 4, p conducting zones 4, 5 and 9 are now disposed in the base member by pre-diffusion with the aid of an oxide mask 16. The impurity material is, for example, boron, and the penetration depth of the zones 4, 5 and 9 is approximately 0.3 to 0.4

μm. Zone 9 forms together with the base member 11 the protective diode whos pn junction at the semiconductor surface is surrounded by a heavily doped n conducting area 7a, obtained by the two implantation processes. At the border area 10 between the pn junction 9a of the protective diode and the heavily doped surface area 7a, the voltage breakdown which protects the gate oxide from destruction occurs in the event the protective diode is loaded in the blocking direction. The pn conducting zones 4 and 5 form the source zone and the drain zone, respectively, of the field-effect transistor.

The indiffusion of zones 9, 4 and 5 may be effected in various ways. After the aforementioned pre-diffusion, during which a penetration depth of approximately 0.35 μm is attained, the penetration depth of the diffusion zones is enlarged in a further annealing process. At 1,000° C. and a diffusion time of 320 minutes, a penetration depth of approximately 2.1 μm, with a surface concentration of approximately $6 \times 10^{18}$ atoms per $cm^3$, is obtained.

Figure 5:
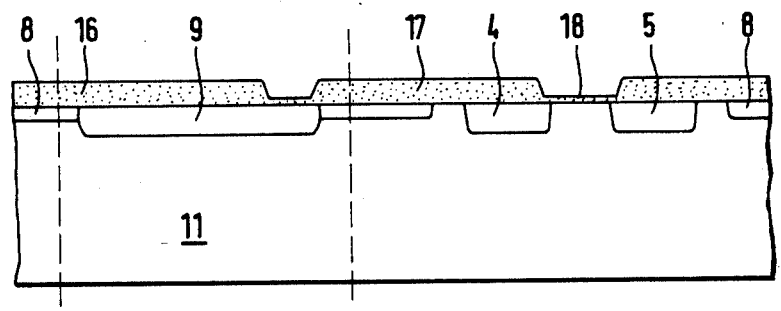

In accordance with FIG. 5, the gate oxide 18 and the field oxide 17 are then produced in the remaining surface areas of the semiconductor arrangement. To this end, an opening above the gate area is preferably made in the field oxide 17 obtained, by a resist and etching process, in order to then produce the gate oxide 18 in a separate oxidation process. This oxidation process is carried out, for example, at 1,000° C. in an oxygen atmosphere. The thickness of the gate oxide layer is, for example, 0.12 μm. The gate oxide layer 18 may also be passivated with phosphorous glass by phophorus acting on the gate oxide at a temperature of approximately 1,050° C. The breakdown voltage of a gate oxide layer produced in this way is approximately 60 to 80 V. The field oxide 17 is approximately 1.1 μm thick.

Figure 6:
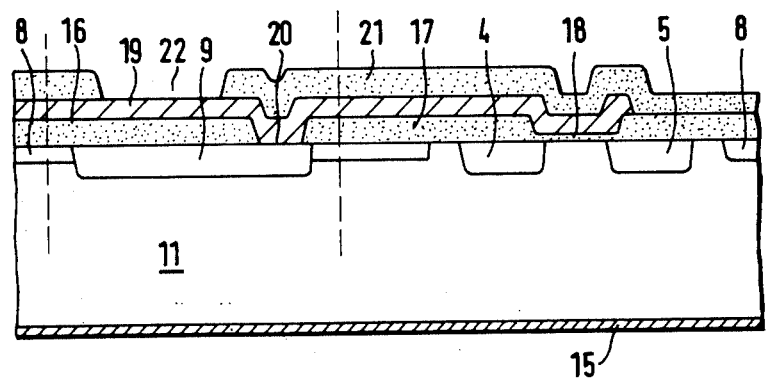

In order to activate the implanted charge carriers, a further temperature process is carried out in a nitrogen atmosphere at approximately 800° C. for a duration of approximately 60 minutes. Finally, in accordance with FIG. 6, contact areas are opened in the field oxide layer 17. In FIG. 6, only the connection contact 20 to the zone 9 of the protective diode is shown. This connection contact 20 is connected via a conduction path 19 to the gate metallization in order to produce the protectiveeffect of the diode. The conduction path 19 may consist of aluminum. A pyrolytic oxide layer 21 may also be disposed as protective layer on the conduction path system. The contacting openings 22 for the conduction paths must then be made in this protective layer 21.

Figure 7:
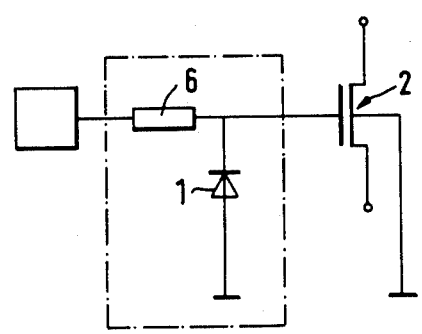
FIG. 7 shows a modified protective circuit with a series resistor.
Figure 8:
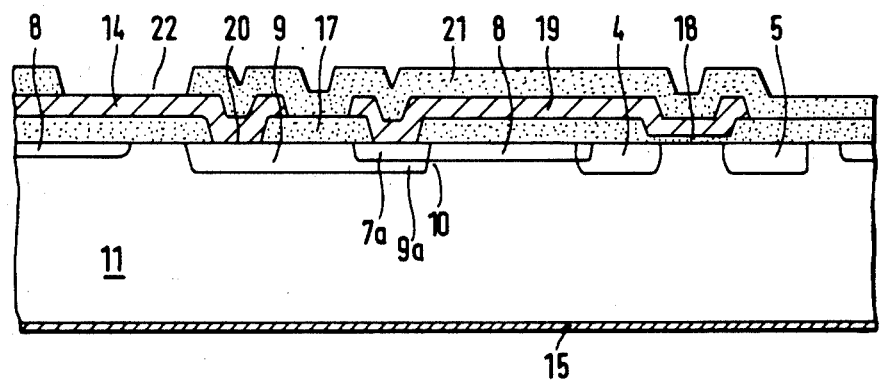
FIG. 8 shows the realized protective circuit in accordance with FIG. 7.

FIG. 7 shows a variant of the protective circuit according to FIG. 1. Here, the gate connection of the field-effect transistor 2 is additionally preceded by a resistor 6. This resistor has a magnitude of approximately 1 kohm and limits the current through the protective diode 1. The realization of this circuit is apparent from FIG. 8. The resistor 6 consists of the path resistance of part of the p conducting zone 9, which together with the n conducting base member 11 forms the protective diode. To this end, the p conducting zone 9 is contacted at its end facing away from the field-effect transistor at the connection point 20 of the connecting conduction path 14 leading to the input of the circuit. The diode contact which is connected via a conduction path 19 to the gate metallization above the gate oxide 18 is located at the end adjacent to the field-effect transistor. In the area of the diode contact, the p conducting zone 9 contains, in addition, the implantation area 7a, which was exposed to both implantation processes, and which extends beyond the border of the pn junction 9a of the protective diode adjacent to the field-effect transistor. A defined voltage breakdown is thereby produced in the border area 10 of the p conducting zone 9 when the blocking voltage at the protective diode exceeds a certain threshold value since the surface area in the border area 10 outside of the zone 9 exhibits a very high concentration of n impurities. The surface area 8 which was exposed to only one implantation process may also, as shown in FIG. 8, extend into the source zone and drain zone 4 and 5, respectively, whereby the breakdown potential of these zones is reduced to a value above the breakdown voltage of the protective diode but beneath the breakdown voltage of the gate oxide. The semiconductor base member is also provided with an ohmic rear side contact 15. This may, for example, be a gold contact.

Figure 9:
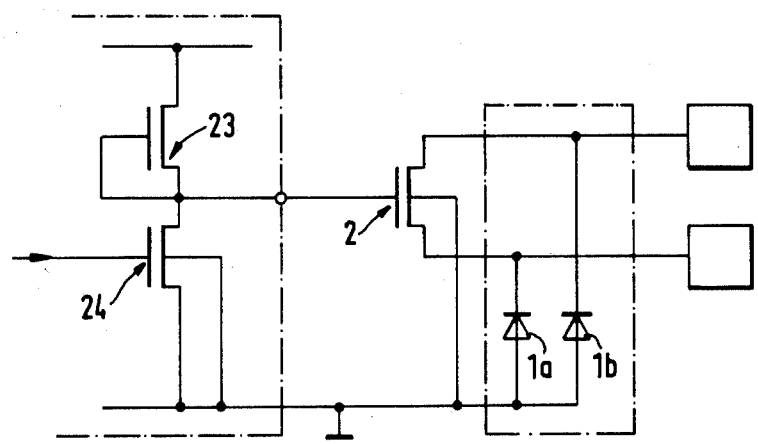
FIG. 9 shows a further variant of the protective circuit.
Figure 10:
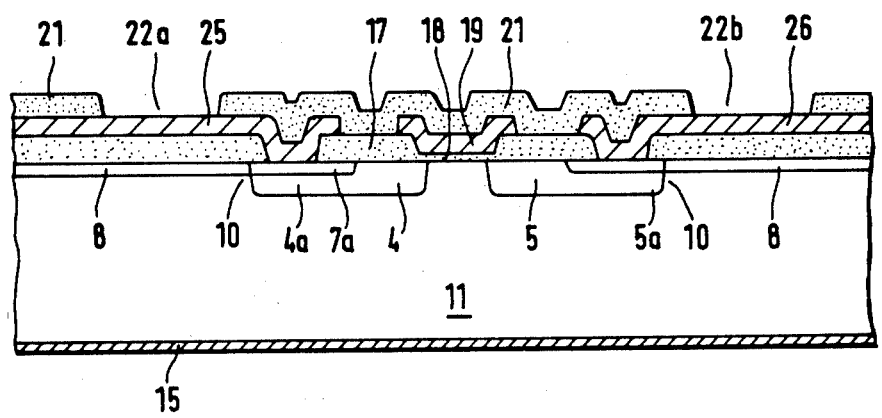
FIG. 10 shows the realization of the protective circuit in accordance with FIG. 9.

FIG. 9 shows a modified circuit design for a circuit wherein the signals via the drain zone and source zone, respectively, might result in destruction of the gate oxide layer. The field-effect transistor 2 is driven via a logic comprising the field-effect transistors 23 and 24 at the gate electrode and may be connected via this logic to reference potential. The drain electrode and the source electrode of the field-effect transistor 2 are, on the other hand, conducted out of the circuit as open connections. In this case, the gate oxide is protected by protective diodes 1a and 1b which are connected between the drain zone and the substrate, and between the source zone and the substrate, respectively. In accordance with FIG. 10, these protective diodes 1a and 1b may be formed by sub-areas 4a and 5a, respectively, of the source zone 4 and the drain zone 5, respectively. The surface area 7a, which was exposed to both implantation processes thus extends into the source zone and the drain zone and overlaps their pn junctions at their end facing away from the gate. Therefore, only the surface area beneath the gate oxide 18 and the immediately adjacent areas of the source zone and the drain zone 4 and 5, respectively, exhibit no implanted surface area. The source zone and the drain zone 4 and 5, respectively, are contacted via conduction paths 25 and 26 at the locations exhibiting the implanted surface area 7a. A defined voltage breakdown then occurs in the border areas 10 at the end of the pn conducting zones 4 and 5 facing away from the channel since the surface area there outside of the pn junction which was exposed to both implantation processes is very heavily n-doped. For formation of the surface layer 8, further areas of the surface of the base member 11 were subjected to only one implantation process by which the charge carrier concentration at the surface and, consequently, the field inversion voltage were increased. The connection contact openings to the conduction paths 25, 26 are designated by 22a and 22b in FIG. 10. The remaining areas of the surface may be passivated with the oxide layer 21. The semiconductor arrangment furthermore comprises the rear side contact 15 which may, for example, consist of gold.

The semiconductor arrangements described hereinabove may contain both depletion field-effect transistors and enhancement field-effect transistors. The base member may, as described, be n-doped, but also p-doped. In the latter case, charge carriers which produce the p conduction type in the semiconductor member are implanted. It should also be noted that no re-doping of the zones 4, 5 and 9 from the conduction type opposite to that of the base member is effected by the implantation processes at the semiconductor surface, but rather in the implantation areas within the aformentioned zones, the implantation causes a reduction in the surface concentration. It is decisive that the voltage breakdown does not occur directly at the semiconductor surface, but rather inside the protective zones, more particularly, in the border area where the pn junctions of the protective zones hit the heavily doped surface areas outside of these protective zones.

What is claimed is:

1. Process for the production of a protective arrangement for a field effect transistor with an insulated gate electrode using an integrated, in-diffused protective diode whose breakdown voltage is less than that of the gate insulating layer of the transistor, Wherein first impurities producing the first conduction type are implanted in the surface of a substrate of the first conduction type in the surface area provided for the protective diode, wherein second impurities producing the first conduction type are then implanted in the surface of the substrate with the exception of the area provided for the field-ffect transistor, and wherein, finally, the source zone and the drain zone and a third zone of the second conduction type forming the protective diode are diffused into the substrate.

2. Process according to claim 1, wherein the surface areas of the substrate provided for the protective diodes coincide with the outside border areas of the source and drain zones and the second implanted impurities are introduced into these border areas.

3. A method of producing a protective arrangement for a field effect transistor having an insulated gate electrode and employing an integrated, in-diffused protective diode whose breakdown voltage is less than that of the gate insulating layer and which has one of its electrodes connected with said gate electrode, comprising the steps of: implanting first impurities which produce the first conductivity type in a first region of the surface of a substrate of the first conductivity type; thereafter, implanting second impurities producing said first conductivity type in the surface of the substrate except for the portion of the substrate surface intended for the channel region of the field effect transistor; and thereafter, simlutaneously diffusing the source zone and the drain zone of the transistor and a third zone for the protective diode, which are all of the second conductivity type, into the surface of said substrate with said third zone being formed at least partially within said first region so as to form a pn-junction with the substrate which at least partially, extends to said substrate surface within said first region; and wherein the implantation quantities are selected such that the desired break-down voltage of the protective diode is realized in said first region due to both of the implantations, while the field inversion voltage is increased in the remaining regions of the substrate surface due to the second implantation.

4. A method as defined in claim 3 wherein said diffused third zone is completely disposed within and surrounded by said first region of said substrate suface.

5. A method as defined in claim 3 wherein said second impurities are implanted in the entire said surface of said substrate except for the region intended for the source and drain zones and the channel region of the field effect transistor.

6. A method as defined in claim 3 further comprising: forming an insulating layer, with openings for said source and drain zones and the portion of said third zone within said first region, on said subbstrate surface; and forming a metal layer on said insulating layer to provide a gate electrode which is ohmically connected to said portion of said third zone in said first region.

* * * * *